United States Patent

Morgan

[11] Patent Number: 6,044,026
[45] Date of Patent: Mar. 28, 2000

[54] TRAP AND DELAY PULSE GENERATOR FOR A HIGH SPEED CLOCK

[75] Inventor: Donald M. Morgan, Boise, Id.

[73] Assignee: Micron Technology, Inc., Boise, Id.

[21] Appl. No.: 09/092,524

[22] Filed: Jun. 5, 1998

[51] Int. Cl.[7] .................................................. G11C 13/00
[52] U.S. Cl. .................... 365/194; 365/233; 365/230.08; 365/189.05; 365/191; 326/93; 327/149; 327/153; 327/162
[58] Field of Search ...................................... 365/226, 233, 365/194, 230.08, 189.05, 191; 395/496; 326/93; 327/149, 153, 162

[56] References Cited

U.S. PATENT DOCUMENTS

| | | | |
|---|---|---|---|
| 5,105,387 | 4/1992 | Childers et al. | 365/189.03 |
| 5,426,333 | 6/1995 | Maeda | 327/536 |
| 5,640,364 | 6/1997 | Merrit et al. | 365/233.5 |
| 5,655,105 | 8/1997 | McLaury | 395/496 |
| 5,682,344 | 10/1997 | Seyyedy | 365/145 |
| 5,682,355 | 10/1997 | Roohparvar | 365/233.5 |
| 5,706,247 | 1/1998 | Merritt et al. | 365/233.5 |
| 5,724,297 | 3/1998 | Noda et al. | 365/226 |
| 5,835,956 | 11/1998 | Park et al. | 711/167 |

*Primary Examiner*—Viet Q. Nguyen
*Attorney, Agent, or Firm*—Schwegman, Lundberg, Woessner & Kluth, P.A.

[57] ABSTRACT

A trap and delay pulse generator for command signals triggered off of a high speed clock allows a device to develop signals before initiating a function and to complete the function after the clock pulse expires and allows overlap of sequential functions. When a device receives a sequence of clock pulses triggering command signals it is necessary that the device complete the functions after the clock pulse expires before receiving a new command signal triggered off of a subsequent clock pulse. The trap and delay pulse generator latches the command signal triggered off of the clock pulse and delays it to ensure an operation is ready to proceed even if the clock signal expires before the present command is completed.

29 Claims, 6 Drawing Sheets

TRAP AND DELAY PULSE GENERATOR FOR A HIGH SPEED CLOCK

TECHNICAL FIELD OF THE INVENTION

The present invention relates generally to electronic circuits and in particular to a synchronous random access memory having a trap and delay pulse generator for a high speed clock.

BACKGROUND OF THE INVENTION

Synchronous random access memory such as synchronous dynamic random access memory (SDRAM) are designed to operate in a synchronous memory system. All input and output signals, with the exception of a clock enable signal during power down and self refresh modes, are synchronized to an active edge of a system clock.

A SDRAM includes an arrangement of memory cells. Each memory cell comprises a storage capacitor for storing a data bit as a charge and an access transistor for accessing the charge. The data bit charge provides either a binary logic high (high) voltage or a binary logic low (low) voltage. Data is stored in the memory cells during a write mode and retrieved during a read mode.

Data is transmitted to and from the memory cells on signal lines, referred to as bit lines or digit lines. The digit lines are coupled to input/output (I/O) lines through I/O transistors used as switches. Each memory cell provides, through a true digit line, the logic state of its stored data bit to a corresponding I/O line. Each memory cell also provides, through a corresponding complimentary digit line, the complementary logic state of its stored data bit to a corresponding I/O complement line. The true digit line and corresponding complimentary digit lines are referred to collectively as a digit line pair.

The memory cells are typically organized as one or more arrays and each memory cell has an address identifying its location in its array. The array organization comprises a configuration of intersecting rows and columns. A memory cell is associated with each intersection. In order to read from or write to a memory cell, that memory cell must be selected, or addressed. A row decoder activates a word line in response to a specified row address. The activated word line turns on the access transistors for each memory cell of the row. A column decoder selects a digit line pair in response to a specified column address. For a read operation the selected word line activates the access transistors for all memory cells in the row, and the column decoder couples the selected digit line pair onto a corresponding I/O line pair.

As set forth above, SDRAM memory cells use storage capacitors to store data. A logical high, or logical "1", is stored as a charge on the capacitor. When a clock pulse initiates a READ command for reading data, the digit line pairs are first equilibrated to the same voltage.

Charge from a particular memory cell is coupled, for example, onto a true digit line, resulting in a small differential voltage between the true digit line and its corresponding complimentary digit line. A sense amplifier senses the small differential voltage across the digit line pair, and further increases the voltage differential to full logic levels for communication to the corresponding I/O lines. The data propagates through I/O isolator transistors onto the I/O lines and into a helper flip flop (HFF). The HFF is a bistable latch which can be fired or strobed with minimum differential to develop full logic levels. The I/O isolator transistors provide resistance between the sense amplifier and the digit line pair. This resistance stabilizes the sense amplifier and speeds up the sensing operation. Once the data has passed through the I/O isolator transistors onto the I/O lines, the HFF amplifies the data to full logic levels used at an output data buffer.

Typically, a minimum amount of time is required to fully perform a READ command before a subsequent READ command is performed. In particular, the HFF requires a minimum voltage separation on the I/O lines to ensure amplification to correct logic levels on the I/O lines for communication to the output data buffer.

If a clock pulse expires while a memory device is currently performing a READ command, an error may occur if the needed voltage separation has not yet been reached and therefore the HFF has not yet been fired to amplify the data on the I/O line pair. In this case, information to be placed in the output data buffer for communication on an output line is not available. The problem is further compounded because the clock pulse triggering the subsequent READ command can arrive before the present READ command is completed.

Therefore, what is needed is a way to delay the clock pulse triggering the READ command until there has been sufficient time for the minimum necessary I/O separation to occur to allow the HFF to amplify to full logic levels the differential voltage placed on the I/O lines through the I/O isolation transistors. For the reasons stated above, and for other reasons stated below which will become apparent to those skilled in the art upon reading and understanding the present specification, there is a need in the art to provide a trap and delay pulse generator for command signals triggered off of a high speed clock in order to allow proper timing for initiating back to back functions.

SUMMARY OF THE INVENTION

A trap and delay pulse generator for a high speed clock device comprises an input stage for receiving a clock pulse, an optional delay path for delaying the clock pulse, an enable circuit for outputting the clock pulse depending on whether a particular function is performed, a latch for latching the clock pulse, and a one-shot pulse generator for outputting a pulse. A pulse width test option is included for widening out the pulse provided by the one-shot pulse generator. A control line coupled to the one-shot pulse generator prevents the output of the pulse after the clock pulse has been latched if the particular function is not to be performed.

In one embodiment, a method of allowing a synchronous dynamic random access memory (SDRAM) to trigger a READ function even after the initiating clock pulse has expired. The method comprises the steps of receiving an externally generated signal triggered off of a high speed clock pulse, enabling the externally generated signal if the SDRAM is to perform a READ function, latching the externally generated signal, delaying the latched externally generated signal to ensure proper I/O line separation, and generating an output pulse for initiation of the READ function.

In another embodiment, a trap and delay pulse generator for a synchronous dynamic random access memory (SDRAM) comprises an input stage for receiving an externally generated signal triggered off of a high speed clock pulse, a delay path coupled to the input stage for receiving and delaying the externally generated signal, an enable circuit coupled to the delay path for receiving and passing through the externally generated signal when the SDRAM performs a READ function, a latch circuit having a delay element coupled to the enable circuit for receiving, latching and delaying the externally generated signal provided by the enable circuit, wherein delay of the externally generated signal ensures the SDRAM has proper separation of the I/O line pair before firing the HFF for the READ function, and a one-shot coupled to the latch for receiving the latched externally generated signal and generating an output pulse for initiation of the READ function. A SDRAM and a computer system incorporating the trap and delay pulse generator is also presented.

The trap and delay pulse generator is useful to high speed clock devices receiving a sequence of clock pulses when it is necessary to complete one function after its initiating clock has expired and where the completion of the first function may overlap a subsequent clock pulse. If a device is dependent upon completing an operation late in the clock cycle following a delay time and the clock pulse expires prior to completing the operation, then the device may not successfully complete the operation. The trap and delay pulse generator latches a clock signal and delays it with a subsequent delay element to ensure an operation is performed independent of the expiration of the clock pulse. In addition, this circuit allows an operation to continue into the delay time of the subsequent operation to allow the full cycle time after the delay.

Therefore, a device operating off of a high speed clock, such as a SDRAM, needs to be ensured that firing the HFF for a current READ command will not occur before proper separation of the paired I/O wires. Once fired the READ operation must not be cut short by the expiration of the clock to ensure reliable data for communication to an output data buffer. In different embodiments of the invention optional configurations of varying scope are described. For instance, optional configurations include an adjustable delay path for delaying a received command signal and a pulse width test option for widening a pulse width of an output pulse. Further embodiments of the invention will become apparent by reference to the drawings and by reading the following detailed description.

DETAILED DESCRIPTION OF THE PREFERRED EMBODIMENT

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense, and the scope of the present inventions is defined only by the appended claims.

The present invention is an apparatus and method for a trap and delay pulse generator for high speed clock devices. A trap and delay pulse generator circuit allows a device to complete a function although the clock may expire during that function. By trapping and delaying a command signal triggered off of a high speed clock pulse, a device is ensured an operation is ready to proceed and will not be cut off by an expiring clock pulse. The present invention is utilized by synchronous random access memory devices to allow sufficient time for sufficient separation of the paired I/O lines to be realized in order to assure successful amplification by the helper flip flop without regards to clock expiration. A computer system and a SDRAM memory device of the present invention are illustrated. Various embodiments of the trap and delay pulse generator circuit are also presented.

Figure 1:
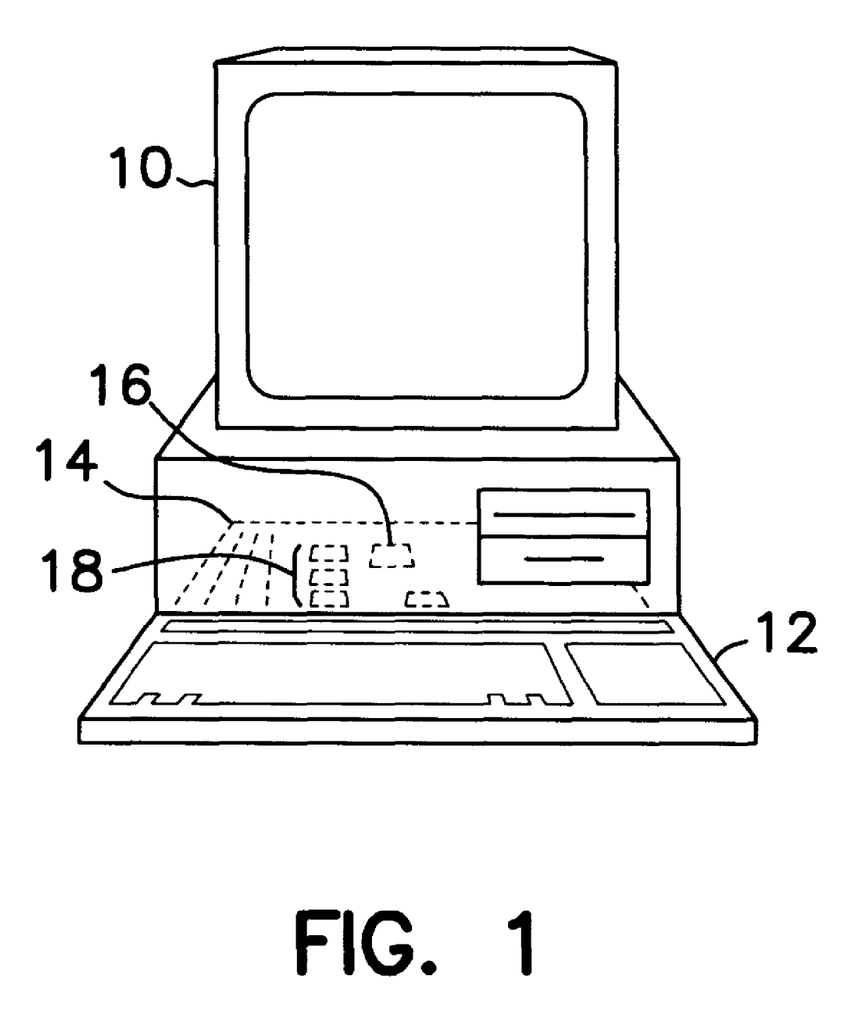
FIG. 1 illustrates a computer of the present invention.

FIG. 1 illustrates a computer incorporating the present invention. The computer includes a monitor 10, keyboard input 12 and a central processing unit 14. The central processing unit 14 typically includes a microprocessor 16 and a plurality of memory slots 18.

The microprocessor 16 produces control and address signals to control the exchange of data between a memory bus circuit and the microprocessor 16. This exchange of data is accomplished over a high speed memory bus. Coupled to the memory bus are a plurality of memory slots 12 which receive memory devices well known to those skilled in the art. For example, single in-line memory modules (SIMMs) and dual in-line memory modules (DIMMs) may be used in the implementation of the present invention.

These memory devices can be produced in a variety of designs which provide different methods of reading from and writing to the dynamic memory cells of the memory slots 12. Alternative types of devices include SDRAM, DDR SDRAM, SLDRAM and Direct RDRAM as well as others such as SRAM or Flash memories.

Figure 2:
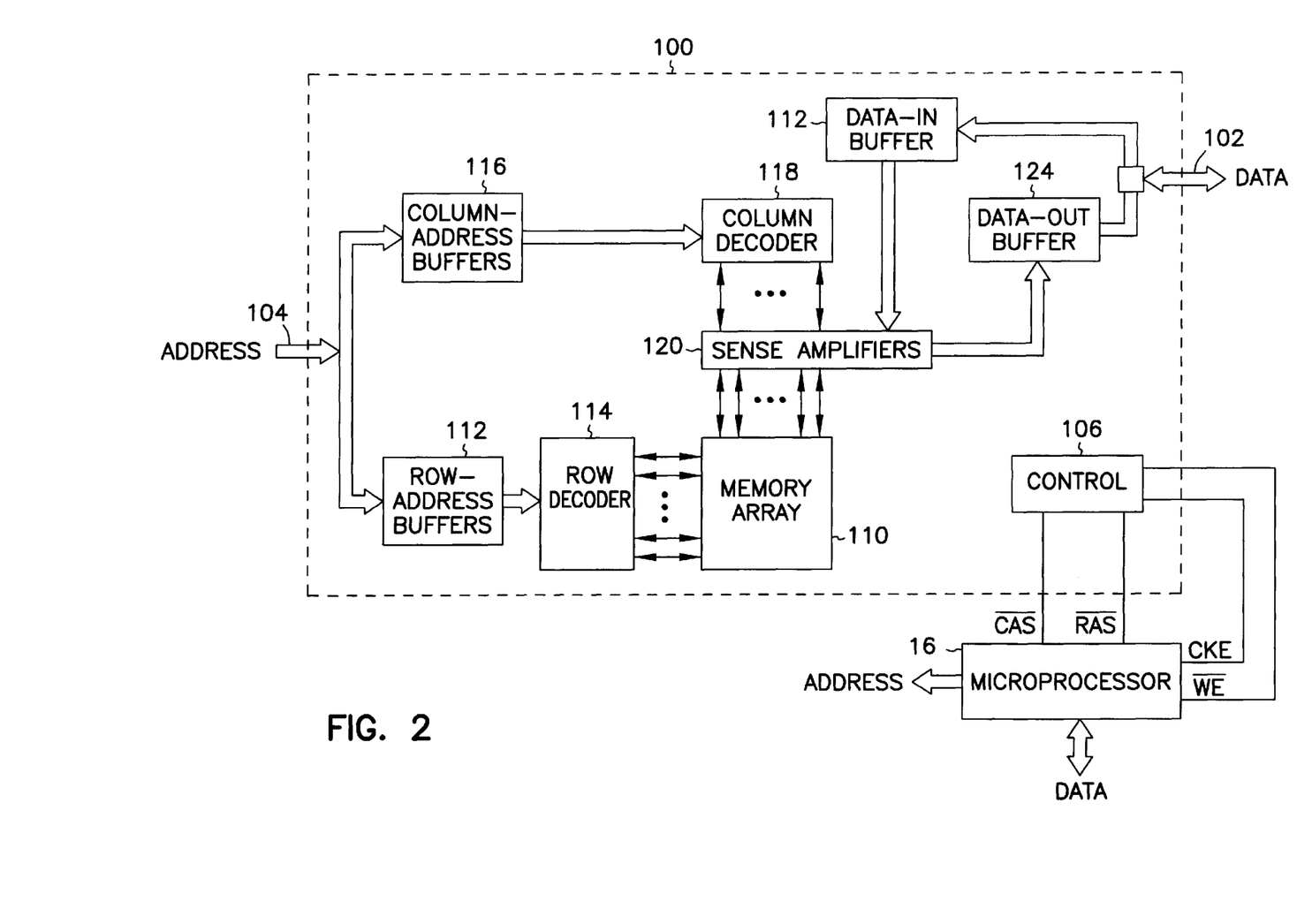
FIG. 2 is a block diagram of a SDRAM memory device.

An embodiment of a SDRAM of the present invention is illustrated generally at 100 in FIG. 2 in block diagram form. The description of the SDRAM 100 has been simplified for purposes of illustrating a SDRAM memory device and is not intended to be a complete description of all the features of a SDRAM. The present invention is not limited to SDRAMs, and is equally applied to other synchronous random access memories devices. Those skilled in the art will recognize that a wide variety of memory devices may be used in the implementation of the present invention.

Control, address and data information provided over a memory bus are represented by individual inputs to the SDRAM 100, as shown in FIG. 2. These individual representations are illustrated by data lines 102, address lines 104 and various discrete lines directed to control logic 106.

As is well known in the art, the SDRAM 100 includes a memory array 110 which in turn comprises rows and columns of addressable memory cells. Each memory cell in a row is coupled to a word line. Additionally, each memory cell in a column is coupled to a bit line. Each cell in the memory array 110 includes a storage capacitor and an access transistor as is conventional in the art.

SDRAM 100 interfaces with, for example, the microprocessor 16 through address lines 104 and data lines 102. Alternatively, SDRAM 100 may interface with a SDRAM controller, a micro-controller, a chip set or other electronic system. The microprocessor 16 also provides a number of control signals to the SDRAM 100, including but not limited to, row and column address strobe signals RAS* and CAS*, a write enable signal WE*, a clock enable signal CKE and other conventional control signals.

The illustrative embodiments described herein concern electrical circuitry which uses voltage levels to represent binary logic states—namely, a "high" logic level and a "low" logic level. Further, electronic signals used by the various embodiments of the present invention are generally considered active when they are high. However, an asterisk (*) following the signal name in this application indicates that the signal is negative or inverse logic. Negative or inverse logic is considered active when the signal is low.

A row address buffer 112 and a row decoder 114 receive and decode row addresses from row address signals provided on address lines 104 by the microprocessor 16. Each unique row address corresponds to a row of cells in memory array 110. The row decoder 114 includes a word line driver, an address decoder tree, and circuitry which translates a given row address received from row address buffers 112 and selectively activates the appropriate word line of memory array 110 via the word line drivers.

A column address buffer 116 and a column decoder 118 receive and decode column address signals provided on address lines 104. The column decoder 118 also determines when a column is defective and the address of a replacement column. The column decoder 118 is coupled to sense amplifiers 120. Sense amplifiers 120 are coupled to complementary pairs of bit lines of memory array 110.

The sense amplifiers 120 are coupled to a data-in buffer 122 and a data-out buffer 124. The data-in buffers 122 and the data-out buffers 124 are coupled to the data lines 102. During a write operation, the data lines 102 provide data to the data-in buffer 122. The sense amplifier 120 receives data from the data-in buffer 122 and stores the data in the memory array 110 as a charge on a capacitor of a cell at an address specified on the address lines 104.

During a read operation, the SDRAM 100 transfers data to the microprocessor 16 from the memory array 110. Complementary bit lines for the accessed cell are equilibrated during a precharge operation to a reference voltage provided by an equilibration circuit and a reference voltage supply. The charge stored in the accessed cell is then shared with the associated bit lines. A sense amplifier of sense amplifiers 120 detects and amplifies a difference in voltage between the complementary bit lines. Address information received on address lines 104 selects a subset of the bit lines and couples them to complementary pairs of input/output (I/O) wires or lines. When the I/O lines are connected to the bit lines the influence of the bit lines begins to cause a voltage separation on the complementary I/O line pairs. After waiting a short time to obtain sufficient separation, a helper flip flop (HFF) is strobed or fired on each I/O pair quickly separating them to fall logic levels. The I/O wires pass the amplified voltage signals to the data-out buffer 124.

The control logic 106 is used to control the many available functions of the SDRAM 100. In addition, various control circuits and signals not detailed herein initiate and synchronize the SDRAM 100 operation as known to those skilled in the art. As stated above, the description of the SDRAM 100 has been simplified for purposes of illustrating the present invention and is not intended to be a complete description of all the features of a SDRAM. Those skilled in the art will recognize that a wide variety of memory devices, including but not limited to, SSDRAMs, SLSDRAMs, RSDRAMs and other SDRAMs and SRAMs, VRAMs and EEPROMs, may be used in the implementation of the present invention. The SDRAM implementation described herein is illustrative only and is not intended to be exclusive or limiting.

Figure 3:
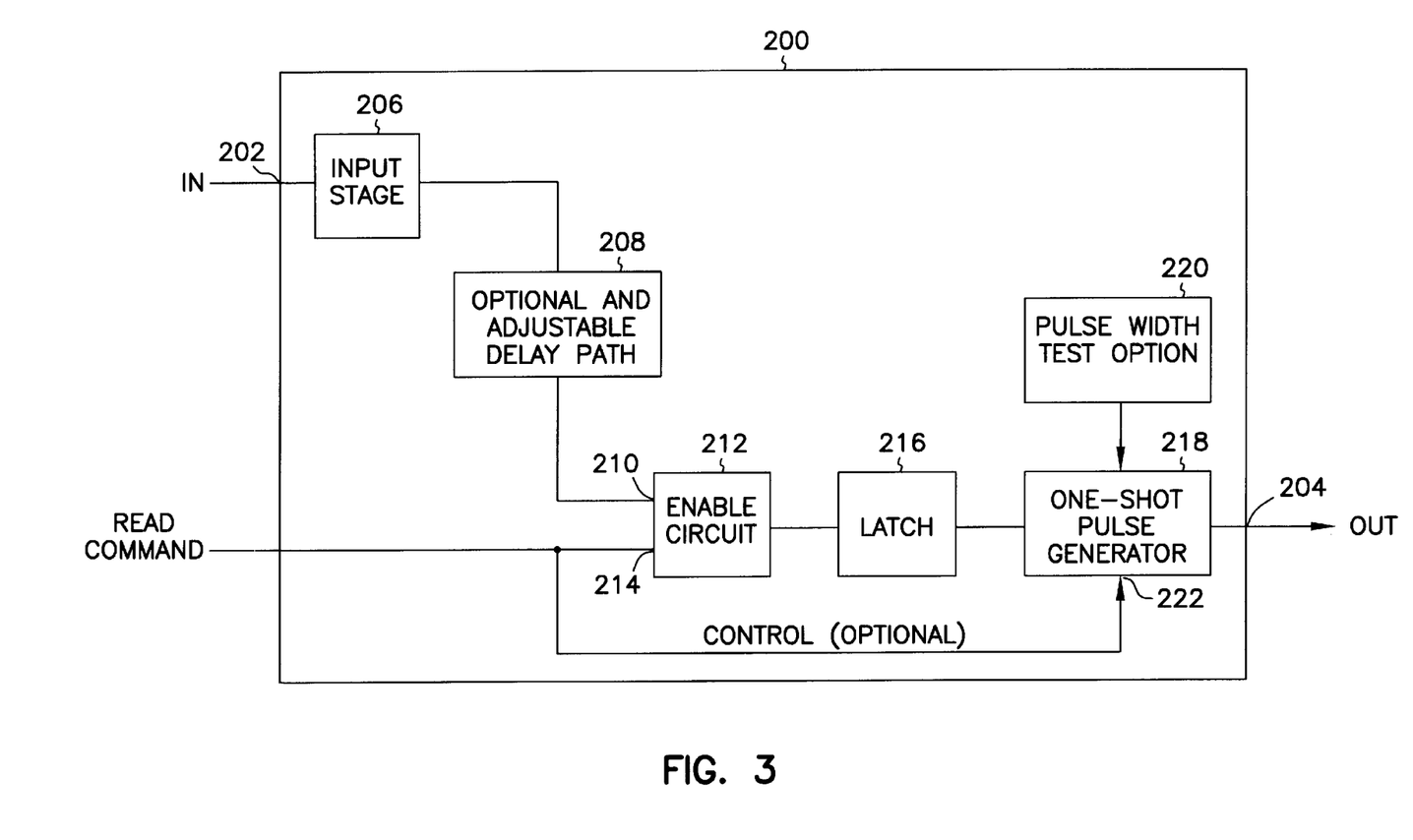
FIG. 3 is a block diagram of a trap and delay pulse generator circuit according to the teachings of the present invention.

FIG. 3 illustrates a block diagram of an embodiment of a trap and delay pulse generator circuit 200 according to the teachings of the present invention. The trap and delay pulse generator circuit 200 is useful for high speed clock devices, such as SDRAM 100. Those skilled in the art will appreciate that the principles of the present invention can be applied to virtually any device operating off of a high speed clock without departing from the scope of the invention.

The trap and delay pulse generator circuit 200 is discussed in relationship to SDRAM 100 performing a READ command while a high speed clock pulse will expire and a next clock pulse will initiate a next command before the current READ has completed. An externally provided signal corresponding to the new READ command is received by the trap and delay pulse generator circuit 200 wherein the external signal is subsequently latched and delayed to ensure the READ will begin after successful column selection and will complete even in the event the clock pulse expires.

Input 202 of an input stage circuit 206 receives the externally generated signal based off of a clock pulse provided by a clock generator. The new READ command is received concurrent to the SDRAM 100 receiving the READ column address. Column selection and data propagation requires a predetermined amount of time, and a new READ command signal received during this time must be delayed to allow time for the data from the selected column to effect at least a minimal separation between the I/O and the I/O complement wires.

To compensate for delays of the current READ command, the externally generated signal, herein after referred to as the external signal, is applied to an adjustable delay path circuit 208. After the external signal has been delayed a predetermined amount of time, the external signal is applied to input 210 of an enable circuit 212.

Since the external signal supports either a column read or a column write for a memory cell location within memory array 110, the enable circuit 212 determines which one is being performed. The trap and delay pulse generator circuit 200 is only applicable to a column read. When a column read is being performed, the external signal is trapped and delayed prior to firing a HFF. This ensures that the HFF has a sufficient level of differential voltage to amplify on the I/O lines corresponding to a selected memory cell. Accordingly, when input 214 receives a READ command parallel to input 210 receiving the external signal, then an output signal is provided to latch circuit 216.

After the external signal has been latched, it is further delayed before reaching a one-shot pulse generator circuit 218. This delay gives the I/O lines enough time to separate with respect to a voltage level so the HFF has a sufficient level of differential voltage to amplify in performing a READ command.

Once the one-shot pulse generator circuit 218 receives the external signal, a pulse is provided via output 204 for firing a HFF. As known to one skilled in the art, the HFF is a high-speed, high-gain bi-stable latch amplifier for amplifying very small read signals appearing on the I/O lines into full CMOS data signals used at the output data buffer 124.

Figure 4:
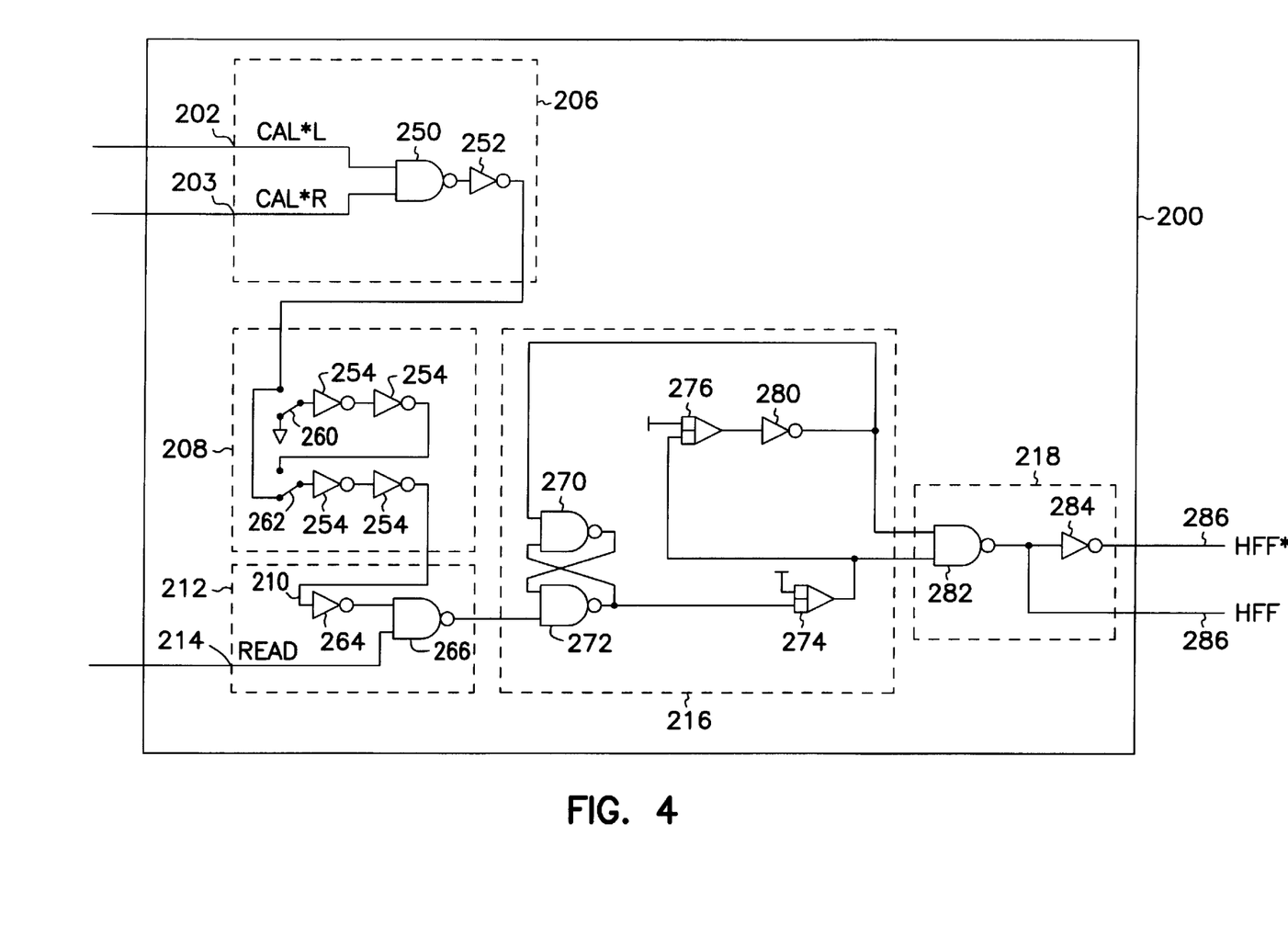
FIG. 4 illustrates a detailed embodiment of a trap and delay pulse generator circuit according to the teachings of the present invention.
Figure 5:
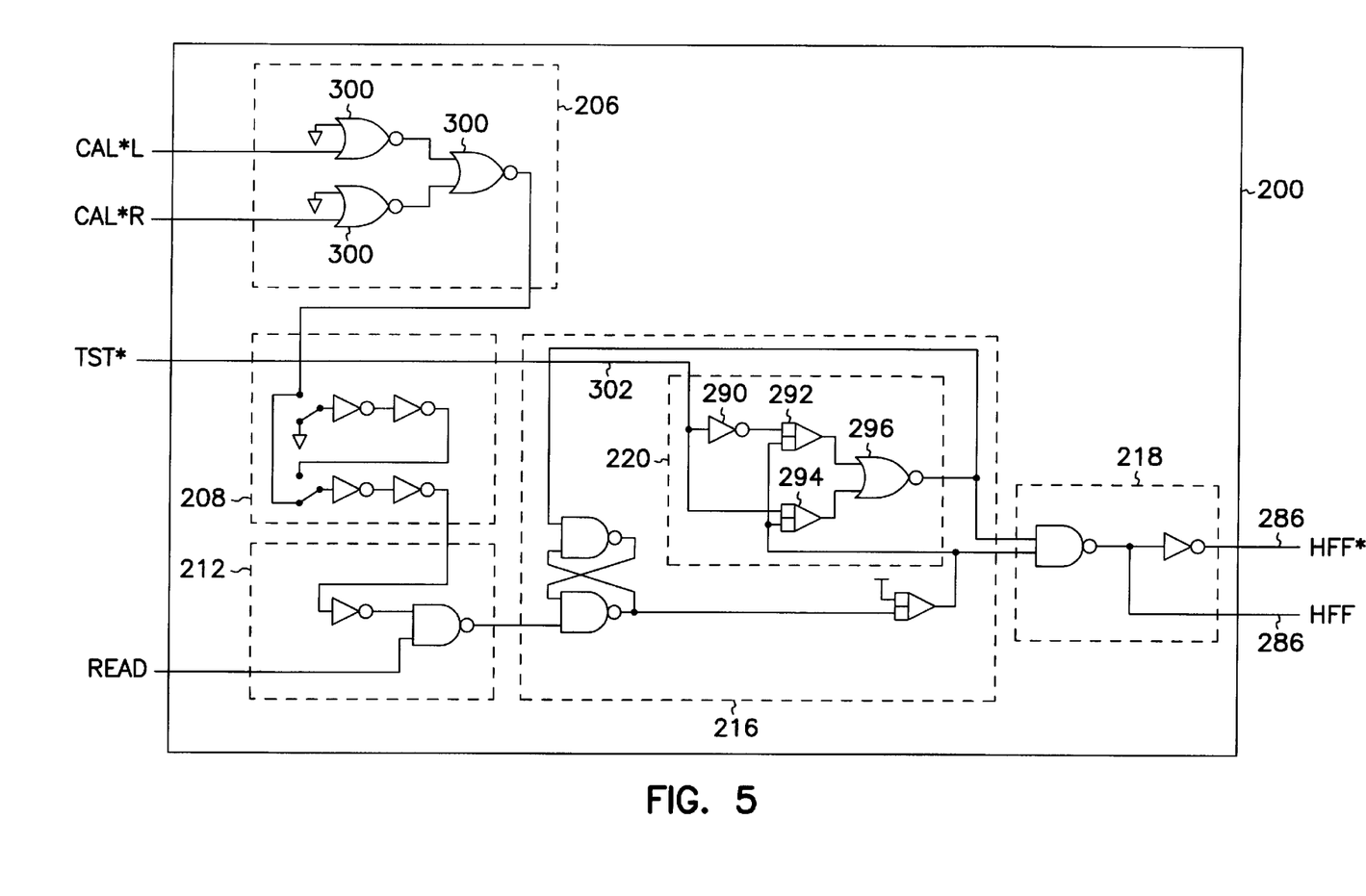
FIG. 5 illustrates an alternative detailed embodiment of a trap and delay pulse generator circuit according to the teachings of the present invention.
Figure 6:
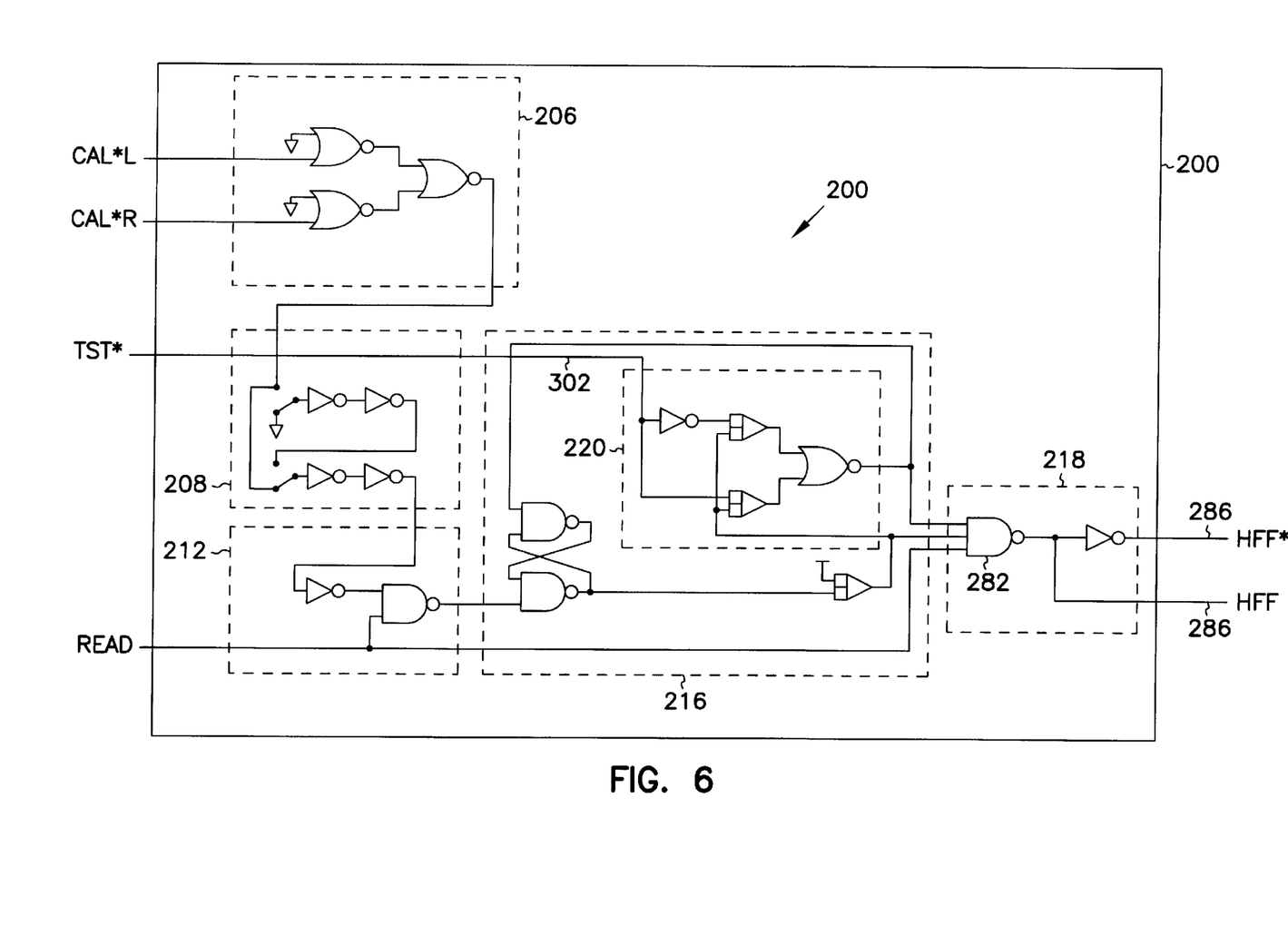
FIG. 6 illustrates an alternative detailed embodiment of a trap and delay pulse generator circuit according to the teachings of the present invention.

Alternative embodiments of the trap and delay pulse generator circuit 200 are illustrated in more detail when references are made to FIGS. 4–6. Still referring to FIG. 3, one alternative embodiment includes a pulse width test option circuit 220 for widening out the pulse provided by the one-shot pulse generator circuit 218. A wider pulse is preferred during a test mode of the SDRAM 100 to allow multiple tasks to occur at one time.

Another embodiment includes a control line coupled to input 222 of the one-shot pulse generator 218 for receiving the same READ command signal applied to input 214 of the enable circuit 212. The READ command applied to input 222 allows the trap and pulse delay generator circuit 200 to prevent a pulse from being provided at output 204 in the event the READ command signal is removed after the external signal has been received by the latch 216. Without the READ command signal being applied to input 222, a pulse signal is provided via output 204 once the latch 216 receives the external signal.

FIG. 4 illustrates a detailed embodiment of a trap and delay pulse generator circuit 200 according to the teachings of the present invention. An externally provided signal comprising a left and a right signal are applied to inputs 202 and 203, respectively, of the input stage circuit 206. One embodiment of the input stage circuit 206 comprises a NAND gate 250 and an invertor 252. The left and right signals have been latched and are triggered off of an externally provided command signal, such as CAS*. A single signal is provided at an output of the input stage circuit 206. For purposes of discussion, this single signal is referred to as the external signal.

The external signal provided by the input stage circuit 206 is applied to an adjustable delay path circuit 208 comprising a plurality of invertors 254 for modeling expected delays before the new READ command is initiated by the SDRAM 100. In this particular embodiment of the adjustable delay path circuit 208, switches 260 and 262 are selected to provide either a short time delay or a long time delay.

A short time delay is accomplished by placing switch 260 in an open position while switch 262 makes contact with the output of the input stage circuit 206. The short time delay directs the signal through two invertors 254 before applying it to input 210 of the enable circuit 212. In contrast, a longer time delay is accomplished by having switch 260 make contact with the output of the input stage circuit 206 and by having switch 262 make contact with the output of the two invertors 254 coupled to switch 260. This particular delay path comprises four invertors 254. Selection of the invertor types 254 varies the expected delay times for routing the signal through the optional delay path circuit 208. The construction and operation of such delays 254 are well known in the art.

After delaying the external signal a predetermined amount of time, it is applied to input 210 of the enable circuit 212. One embodiment of the enable circuit 212 comprises an invertor 264 coupled to input 212 and a NAND gate 266. A first input of the NAND gate 266 receives the external signal provided by the invertor 264 and a second input receives a READ command signal via input 214. The READ command signal corresponds to a read function to be performed by the SDRAM 100.

The trap and delay pulse generator circuit 200 only operates when the SDRAM 100 is performing a read function. If the external signal is simultaneously applied to input 210 when input 214 receives a READ command signal corresponding to a read function, then the enable circuit 212 applies the external signal to an input of latch circuit 216.

One embodiment of the latch circuit 216 comprises cross-coupled NAND gates 270, 272, a plurality of delay units 274, 276 and an invertor 280. After the external signal has been latched by the cross-coupled NAND gates 270, 272, the external signal is applied to the delay units 274, 276. The latch circuit 216 latches the external signal and delays it with a subsequent delay element 274 to ensure the current READ command is ready to proceed to fire the HFF with enough separation on the I/O wires to ensure successful sensing.

The external signal, after having been latched by latch 216, is applied to a one-shot pulse generator circuit 218 comprising a NAND gate 282 and an invertor 284. The one-shot pulse generator 218 operates off of the latched signal to provide a pulse signal at outputs 286 and 288. The latched signal is finite in duration because the latch circuit 216 comprises an invertor 280 for inverting the signal applied to an input of NAND gate 270 for resetting the cross-coupled NAND gates 270, 272. The one-shot pulse generator 218 is thus active while the external signal is latched. Once the latch circuit 216 is reset, the one-shot pulse generator 218 become inactive.

The pulse signal provided at output 286 is inverted by invertor 284 whereas the pulse signal provided at output 288 is at an opposite level. The pulsed outputs of the one-shot pulse generator circuit 218 fires a HFF for amplifying a differential voltage across an I/O line corresponding to a particular memory cell. The pulse width of the output pulses provided to outputs 286 and 288 are substantially maintained to an approximate desired finite width as determined by delay element 276 in latch circuit 216.

FIG. 5 illustrates an alternative detailed embodiment of a trap and delay pulse generator circuit 200 according to the teachings of the present invention. A distinctive variation to the embodiment presented in FIG. 4 is the addition of a pulse width test option circuit 220. The pulse width test option circuit 220 is primarily used during a test mode of the SDRAM 100 for making wider the width of the pulses provided by the one-shot pulse generator 218 at outputs 286, 288.

The pulse width test option circuit 220 comprises an invertor 290, delays 290, 294 and NOR gate 296. Delay 294 was initially shown as part of the latch circuit 216 illustrated in FIG. 4. A test signal is applied to input 302 of the pulse width test option circuit 220. The received test signal is split so that it is applied to an input of the invertor 290 and is applied to an input of delay 294. An output of the invertor 290 provides an inverted signal to an input of delay 282. The output of delay 282 is applied to a first input of NOR gate 296. An output of delay 294 is applied to a second input of NOR gate 296. The output test signal of the NOR gate is applied to an input of NAND gate 282, which is part of the one-shot pulse generator circuit 218.

Input TST* 302 is a DC signal applied prior to the execution of a READ cycle. Delays 282 and 294 are AND function delays. Therefore, if the TST* signal is in the inactive high state, delay 282 is enabled and provides a shorter one shot pulse on outputs 286 and 288. If TST* is active low, then delay 294 is disabled and delay 282 provides a longer pulse at the outputs.

By widening the pulse width of the output pulses of the latch circuit 216, more than one column can be fired so that the SDRAM 100 can internally compare the results. In other words, the pulse width test option 220 utilizes less cycles so that testing is conducted faster.

Still referring to FIG. 5, an alternative embodiment of the input stage circuit 206 is presented. Instead of a NAND gate and an invertor receiving the left and right externally provided signals as illustrated in FIG. 4, a plurality of NOR gates 300 are used to receive these signals. The external signal is applied to the adjustable delay path circuit 208 in the same manner as discussed when reference was made to FIG. 4.

FIG. 6 illustrates an alternative detailed embodiment of a trap and delay pulse generator circuit 200 according to the teachings of the present invention. A distinctive variation to the embodiment presented in FIG. 5 is the addition of a READ command signal input provided to the NAND gate 282 located in the one-shot pulse generator circuit 218.

The READ command signal input added to the NAND gate 282 causes the NAND gate 282 to function as an enable switch for the one-shot pulse generator circuit 218 in the event the READ command signal is removed after the signal has been latched. Without applying the READ command signal as an input to the NAND gate 282, a pulse output corresponding to the latched signal can not be prevented once the signal has been latched. Therefore, this particular embodiment to the trap and delay pulse circuit 200 prevents an output pulse from being inadvertently generated for firing a HFF when a READ command is not being performed.

Conclusion

A trap and delay pulse generator circuit 200 has been discussed in relationship to a SDRAM 100 performing a current READ command while a high speed clock pulse may expire before the READ is completed. The trap and delay pulse generator circuit 200 comprises an input stage circuit 206 for receiving an external signal triggered off of the high speed clock pulse, an optional delay path 208 for delaying the external signal, an enable circuit 212 for outputting the external signal if the SDRAM is performing a READ command, a latch circuit 216 for latching the external signal, and a one-shot pulse generator circuit 218 for outputting a pulse corresponding to the received external signal. An alternative embodiment for the trap and delay pulse generator circuit 200 includes a pulse width test option circuit 220 for widening out the pulse provided by the one-shot pulse generator circuit 218. A further alternative embodiment includes a control line coupled to input 222 of the one-shot pulse generator 218 for receiving the same READ command signal applied to input 214 of the enable circuit 212. The READ command signal applied to input 222 allows the trap and pulse delay generator circuit 200 to prevent a pulse from being provided at output 204 in the event the READ command signal is removed after the external signal has been received by the latch 216.

Although specific embodiments have been illustrated and described herein, it will be appreciated by those skilled in the art that any arrangement which is calculated to achieve the same purpose may be substituted for the specific embodiment of the present invention. This application is intended to cover any adaptations or variations of the present invention.

What is claimed is:

1. A trap and delay pulse generator for a device receiving a series of clock pulses comprising:

an input stage for receiving a clock pulse;

an enable circuit coupled to the input stage for receiving and passing through the clock pulse when the device is to perform a function corresponding to the received clock pulse;

a latch circuit having a delay element coupled to the enable circuit for receiving the clock pulse provided by the enable circuit, wherein the clock pulse is delayed by a predetermined amount of time to ensure the device is configured for the function before initiating the function; and a one-shot pulse generator coupled to the latch for receiving the latched clock pulse and generating an output pulse for initiation of the function;

wherein the latch circuit can be automatically reset.

2. A trap and delay pulse generator for a device receiving a series of clock pulses comprising:

an input stage for receiving a clock pulse;

an enable circuit coupled to the input stage for receiving and passing through the clock pulse when the device is to perform a function corresponding to the received clock pulse;

a latch circuit having a delay element coupled to the enable circuit for receiving the clock pulse provided by the enable circuit, wherein the clock pulse is delayed by a predetermined amount of time to ensure the device is configured for the function before initiating the function;

a one-shot pulse generator coupled to the latch for receiving the latched clock pulse and generating an output pulse for initiation of the function; and a pulse width circuit coupled to the one-shot pulse generator for adjusting a pulse width of the output pulse.

3. The trap and delay pulse generator of claim 2 wherein the pulse width is dependent upon the amount of time the clock pulse is latched by the latch circuit.

4. A trap and delay pulse generator for a device receiving a series of clock pulses comprising:

an input stage for receiving a clock pulse;

an enable circuit coupled to the input stage for receiving and passing through the clock pulse when the device is to perform a function corresponding to the received clock pulse;

a latch circuit having a delay element coupled to the enable circuit for receiving the clock pulse provided by the enable circuit, wherein the clock pulse is delayed by a predetermined amount of time to ensure the device is configured for the function before initiating the function;

a one-shot pulse generator coupled to the latch for receiving the latched clock pulse and generating an output pulse for initiation of the function; and a control input coupled to the one-shot pulse generator for inhibiting generation of the output pulse after the clock pulse has been latched if the new function is not to be performed.

5. The trap and delay pulse generator of claim 1 wherein the device is a synchronous dynamic random access memory (SDRAM).

6. The trap and delay pulse generator of claim 5 wherein the function is a READ command.

7. The trap and delay pulse generator of claim 1 further comprising a delay circuit coupled to the input stage for receiving and delaying the command signal to the enable circuit.

8. The trap and delay pulse generator of claim 7 wherein the delay circuit is adjustable.

9. A trap and delay pulse generator for a device receiving a series of clock pulses comprising:

an input stage for receiving at least one clock pulse and generating an output clock signal;

an adjustable delay circuit coupled to the input stage for receiving the output clock signal and providing a delayed output signal on an output connection;

an enable circuit having a first input connection coupled to the output connection of the adjustable delay circuit, the enable circuit has a second input connection coupled to receive an enable signal;

a latch circuit having an input connection coupled to an output connection of the enable circuit; and a one-shot pulse generator coupled to an output connection of the latch circuit to generate an output pulse.

10. The trap and delay pulse generator of claim 9 embodied in an integrated circuit and wherein the enable signal is active when the integrated circuit performs a specific operation.

11. The trap and delay pulse generator of claim 10 wherein the integrated circuit is a memory device and the specific operation is a read operation.

12. The trap and delay pulse generator of claim 9 wherein the adjustable delay circuit comprises a plurality of series coupled inverter circuits and a plurality of switches.

13. The trap and delay pulse generator of claim 9 wherein the enable circuit comprises a NAND gate.

14. The trap and delay pulse generator of claim 9 wherein the latch circuit comprises a pair of cross coupled NAND gates and a delay circuit coupled to an output connection of the cross coupled NAND gates.

15. The trap and delay pulse generator of claim 14 wherein the latch circuit further comprises a pulse width test option circuit to widen a signal pulse provided by the one-shot pulse generator circuit.

16. The trap and delay pulse generator of claim 15 wherein the pulse width test option circuit comprises a plurality of controllable delay circuits coupled to receive an output from the delay circuit, the plurality of controllable delay circuits can be selectively activated in response to a test signal input.

17. The trap and delay pulse generator of claim 9 wherein the one-shot pulse generator comprises a NAND gate to receive first and second input signals, wherein the first and second input signals are complementary signals and the second input signal is delayed in time behind the first input signal.

18. The trap and delay pulse generator of claim 9 wherein the one-shot pulse generator comprises a NAND gate to receive first, second and third input signals, wherein the first and second input signals are complementary signals and the second input signal is delayed in time behind the first input signal, the third input signal is the enable signal.

19. A trap and delay pulse generator for a device receiving a series of clock pulses comprising:

an input stage for receiving at least one clock pulse and generating an output clock signal;

an adjustable delay circuit coupled to the input stage for receiving the output clock signal and providing a delayed output signal on an output connection;

an enable circuit having comprising a first NAND gate having a first input connection coupled to the output connection of the adjustable delay circuit via an inverter circuit, the first NAND gate has a second input connection coupled to receive an enable signal;

a latch circuit comprising second and third cross-coupled NAND gates and a delay circuit coupled to an output connection of the cross coupled NAND gates, the latch circuit has an input connection coupled to an output connection of the enable circuit;

a first delay element coupled to an output connection of the cross coupled NAND gates;

a second delay element coupled to an output connection of the first delay element;

a logic gate coupled to an output connection of the second delay element; and a one-shot pulse generator coupled to an output connection of the logic gate and the output of the first delay element.

20. The trap and delay pulse generator of claim 19 wherein the one-shot pulse generator is deactivated in response to the enable signal.

21. The trap and delay pulse generator of claim 19 wherein the logic gate is an inverter.

22. The trap and delay pulse generator of claim 19 wherein the logic gate is an NOR gate.

23. The trap and delay pulse generator of claim 19 embodied in an integrated circuit and wherein the enable signal is active when the integrated circuit performs a specific operation.

24. The trap and delay pulse generator of claim 23 wherein the integrated circuit is a memory device and the specific operation is a read operation.

25. A trap and delay pulse generator for a device receiving a series of clock pulses comprising:

an input stage for receiving at least one clock pulse and generating an output clock signal;

an adjustable delay circuit coupled to the input stage for receiving the output clock signal and providing a delayed output signal on an output connection, the adjustable delay circuit comprises plurality of series coupled inverter circuits and a plurality of switches;

an enable circuit having comprising a first NAND gate having a first input connection coupled to the output connection of the adjustable delay circuit via an inverter circuit, the first NAND gate has a second input connection coupled to receive an enable signal;

a latch circuit comprising second and third cross-coupled NAND gates and a delay circuit coupled to an output connection of the cross coupled NAND gates, the latch circuit has an input connection coupled to an output connection of the enable circuit;

a first delay element coupled to an output connection of the cross coupled NAND gates;

a pulse width test option circuit coupled to an output connection of the first delay element; and a one-shot pulse generator coupled to an output connection of the pulse width test option circuit and the output of the first delay element.

26. The trap and delay pulse generator of claim 25 wherein the pulse width test option circuit comprises a plurality of controllable delay circuits coupled to receive the output connection of the first delay element, the plurality of controllable delay circuits can be selectively activated in response to a test signal input.

27. The trap and delay pulse generator of claim 25 wherein the one-shot pulse generator is deactivated in response to the enable signal.

28. The trap and delay pulse generator of claim 25 embodied in an integrated circuit and wherein the enable signal is active when the integrated circuit performs a specific operation.

29. The trap and delay pulse generator of claim 28 wherein the integrated circuit is a memory device and the specific operation is a read operation.

* * * * *